US 8,519,406 B2

(12) United States Patent
Yoon et al.

(10) Patent No.: US 8,519,406 B2
(45) Date of Patent: Aug. 27, 2013

(54) ORGANIC LIGHT EMITTING DISPLAY DEVICE HAVING GRAPHENE WIRINGS

(75) Inventors: Seok-Gyu Yoon, Yongin (KR);
Kyu-Hwan Hwang, Yongin (KR);
Jae-Heung Ha, Yongin (KR);
Young-Woo Song, Yongin (KR);
Jong-Hyuk Lee, Yongin (KR);
Sung-Chul Kim, Yongin (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 169 days.

(21) Appl. No.: 13/108,777

(22) Filed: May 16, 2011

(65) Prior Publication Data
US 2012/0153286 A1    Jun. 21, 2012

(30) Foreign Application Priority Data

Dec. 20, 2010  (KR) .................. 10-2010-0130930

(51) Int. Cl.
| | | |
|---|---|---|
| H01L 27/14 | (2006.01) | |
| H01L 29/04 | (2006.01) | |
| H01L 31/036 | (2006.01) | |
| H01L 29/08 | (2006.01) | |
| H01L 35/24 | (2006.01) | |
| H01L 51/00 | (2006.01) | |
| H01L 29/10 | (2006.01) | |
| H01J 1/62 | (2006.01) | |
| H01J 63/04 | (2006.01) | |
| G09G 3/30 | (2006.01) | |
| G09G 5/00 | (2006.01) | |
| G06F 3/038 | (2013.01) | |

(52) U.S. Cl.
USPC .......... 257/72; 257/40; 257/59; 257/E51.022; 313/504; 345/76; 345/204

(58) Field of Classification Search
None
See application file for complete search history.

(56) References Cited

U.S. PATENT DOCUMENTS

| | | | |
|---|---|---|---|
| 2006/0194500 A1 | 8/2006 | Ishii | |
| 2009/0071533 A1 | 3/2009 | Choi et al. | |
| 2009/0121982 A1* | 5/2009 | Choi et al. | ............ 345/76 |
| 2010/0044685 A1* | 2/2010 | Kim et al. | ............ 257/40 |
| 2010/0044692 A1* | 2/2010 | Kim et al. | ............ 257/40 |
| 2011/0115006 A1* | 5/2011 | Sato | ............ 257/296 |
| 2011/0241014 A1 | 10/2011 | Yoon et al. | |

FOREIGN PATENT DOCUMENTS

| | | |
|---|---|---|
| KR | 10-0909547 | 9/2007 |
| KR | 1020080052153 A | 6/2008 |
| KR | 10-2009-0028007 | 3/2009 |
| KR | 1020110111104 | 10/2011 |

* cited by examiner

Primary Examiner — Michael Jung
(74) Attorney, Agent, or Firm — Robert E. Bushnell, Esq.

(57) ABSTRACT

An organic light emitting display device has high transmittancy to external light. The organic light emitting display device includes a substrate; a first wiring formed on the substrate in a first direction; second and third wirings formed on the substrate in a second direction; a first thin film transistor connected to the first and second wirings; a second thin film transistor connected to the first thin film transistor and the third wiring; and an organic light emitting display panel (OLED) connected to the second thin film transistor, wherein the second and third wirings are formed of graphene.

17 Claims, 7 Drawing Sheets

FIG. 8

ORGANIC LIGHT EMITTING DISPLAY DEVICE HAVING GRAPHENE WIRINGS

CLAIM OF PRIORITY

This application makes reference to, incorporates the same herein, and claims all benefits accruing under 35 U.S.C. §119 from an application for an ORGANIC LIGHT EMITTING DISPLAY DEVICE earlier filed in the Korean Intellectual Property Office on 20 Dec. 2010 and there duly assigned Serial No. 10-2010-0130930.

BACKGROUND OF THE INVENTION

1. Field of the Invention

The present invention relates to an organic light emitting display device, and more particularly, to an organic light emitting display device including source electrodes, drain electrodes, and wirings, which are all formed of graphene.

2. Description of the Related Art

Organic light emitting display devices have been widely applied to personal mobile devices such as MP3 players, mobile phones, and televisions due to their superior performance and characteristics, such as wide viewing angle, high contrast, rapid response, and tow power consumption, organic. Attempts to make transparent organic light emitting display devices have been made.

In particular, when wirings are formed of an opaque metal, the transmittancy of an organic light emitting display device is reduced. Also, as the resolution of the organic light emitting display device increases, the ratio of area occupied by the wirings in the organic light emitting display device increases, and accordingly, when the wirings are formed of an opaque metal, the transmittancy of the organic light emitting display device is markedly reduced.

SUMMARY OF THE INVENTION

To address the above and/or other problems, the present invention provides organic light emitting display devices having high transmittancy of external light.

According to an aspect of the present invention, there is provided an organic light emitting display device including a substrate; a first wiring formed on the substrate in a first direction; second and third wirings formed on the substrate in a second direction; a first thin film transistor connected to the first and second wirings; a second thin film transistor connected to the first thin film transistor and the third wiring; and an organic light emitting display device (OLED) connected to the second thin film transistor, wherein the second and third wirings are formed of graphene.

The first thin film transistor may include an active layer formed on the substrate; a gate electrode formed at a location of the substrate corresponding to the active layer by being insulated from the active layer; an insulating layer covering the gate electrode and having openings connected to the active layer; and source and drain electrodes that are formed on the insulating layer and connected to the active layer through the openings, wherein the source and drain electrodes comprise first portions buried in the openings and second portions formed on the insulating layer, and the first portions and the second portions are formed of materials different from each other.

The first portions may be formed of at least one metal selected from the group consisting of Ti, Mo, Al, and Cu, and the second portions may be formed of graphene.

The first portions may be formed of at least one metal selected from the group consisting of ITO, IZO, ZnO, $In_2O_3$, $SnO_2$, and $AlZnO_x$, and the second portions may be formed of graphene.

The second portions may be connected to the second wiring, and may be formed of the same material as the second wiring.

The second thin film transistor may include an active layer formed on the substrate; a gate electrode formed at a location of the substrate corresponding to the active layer by being insulated from the active layer; an insulating layer covering the gate electrode and having openings connected to the active layer; and source and drain electrodes that are formed on the insulating layer and connected to the active layer through the openings, wherein the source and drain electrodes comprise first portions buried in the openings and second portions formed on the insulating layer, and the first portions and the second portions are formed of materials different from each other.

The first portions may be formed of at least one metal selected from the group consisting of Ti, Mo, Al, and Cu, and the second portions may be formed of graphene.

The first portions may be formed of at least one metal selected from the group consisting of ITO, IZO, ZnO, $In_2O_3$, $SnO_2$, and $AlZnO_x$, and the second portions may be formed of graphene.

The second portions may be connected to the third wiring, and may be formed of the same material as the second wiring.

The organic light emitting display may include a pixel electrode connected to the drain electrode; a facing electrode formed facing the pixel electrode; and a light emitting member that generates light by being interposed between the pixel electrode and the facing electrode.

According to another aspect of the present invention, there is provided an organic light emitting display device including a substrate having a transmitting region through which external light passes and a pixel region adjacent to the transmitting region; a first wiring formed on the substrate in a first direction to pass through the pixel region; second and third wirings formed on the substrate in a second direction to pass through the pixel region and the transmitting region; a first thin film transistor located in the pixel region and connected to the first and second wirings; a second thin film transistor located in the pixel region and connected to the first thin film transistor and the third wiring; a pixel electrode connected to the second thin film transistor, located in the pixel region, and disposed to cover the first and second thin film transistors; a facing electrode that faces the pixel electrode, allows light to pass therethrough, and is located across the transmitting region and the pixel region; and a light emitting member that generates light by being interposed between the pixel electrode and the facing electrode, wherein the second and third wirings are formed of graphene.

The first thin film transistor may include an active layer formed on the substrate; a gate electrode formed at a location of the substrate corresponding to the active layer by being electrically insulated from the active layer; an insulating layer covering the gate electrode and having openings connected to the active layer; and source and drain electrodes formed on the insulating layer and connected to the active layer through the openings, wherein the source and drain electrodes comprise first portions buried in the openings and second portions formed on the insulating layer, and the first portions and the second portions are formed of materials different from each other.

The first portions may be formed of at least one metal selected from the group consisting of Ti, Mo, Al, and Cu, and the second portions may be formed of graphene.

The first portions may be formed of at least one metal selected from the group consisting of ITO, IZO, ZnO, $In_2O_3$, $SnO_2$, and $AlZnO_x$, and the second portions may be formed of graphene.

The second portions may be connected to the second wiring, and may be formed of the same material as the second wiring.

The second thin film transistor may include: an active layer formed on the substrate; a gate electrode formed on a location of the substrate corresponding to the active layer by being insulated from the active layer; an insulating layer that covers the gate electrode and has openings connected to the active layer; and source and drain electrodes that are formed on the insulating layer and are connected to the active layer through the openings, wherein the source and drain electrodes comprise first portions buried in the openings and second portions formed on the insulating layer, and the first portions and the second portions are formed of materials different from each other.

The first portions may be formed of at least one metal selected from the group consisting of Ti, Mo, Al, and Cu, and the second portions may be formed of graphene.

The first portions may be formed of at least one metal selected from the group consisting of ITO, IZO, ZnO, $In_2O_3$, $SnO_2$, and $AlZnO_x$, and the second portions may be formed of graphene.

The second portions may be connected to the third wiring, and may be formed of the same material as the second wiring.

As described above, according to the present invention, since the source and drain electrodes and wirings are formed of graphene having high transmittancy to external light, an organic light emitting display device having high transmittancy to external light can be obtained.

In particular, due to physical properties of graphene, the application of graphene in openings where the source and drain electrodes were buried was difficult. Accordingly, in the prior art, all wirings could not be formed of graphene. However, according to the present invention, when the source and drain electrodes are formed, all of the wirings can be formed of graphene because the openings are formed of a metal or a metal oxide together with graphene.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings, in which like reference symbols indicate the same or similar components in which.

DETAILED DESCRIPTION OF THE INVENTION

The invention may be made various changes and embodied in many different forms, and thus, the present invention will now be described more fully with reference to the accompanying drawings in which exemplary embodiments of the present invention are shown. However, the present invention it should not be construed as being limited to the embodiments set forth herein; rather, it is understood that these embodiments include all changes, equivalents, and substitutes that can be included in the spirit and technique of the present invention. In describing the present invention, when practical descriptions with respect to related known function and configuration may unnecessarily make unclear of the scope of the present invention, the descriptions thereof will be omitted.

It will be understood that, although the terms first, second, third, etc., may be used herein to describe various elements, the elements should not be limited by these terms. Thus, the terms are used only to distinguish constituent elements from one another.

The terminology used herein is for the purpose of describing particular embodiments only and is not intended to be limiting of the present invention. A singular forms includes plural forms unless the context clearly indicates otherwise. It will further be understood that the terms "comprise" and/or "comprising" when used in this specification, specify the presence of stated features, integers, steps, operations, elements, and/or components, but do not preclude the presence or addition of one or more other features, integers, steps, operations, elements, components, and/or groups thereof.

The general inventive concept of the present invention is described more fully below with reference to the accompanying drawings in which exemplary embodiments of the present invention are shown.

Figure 1:
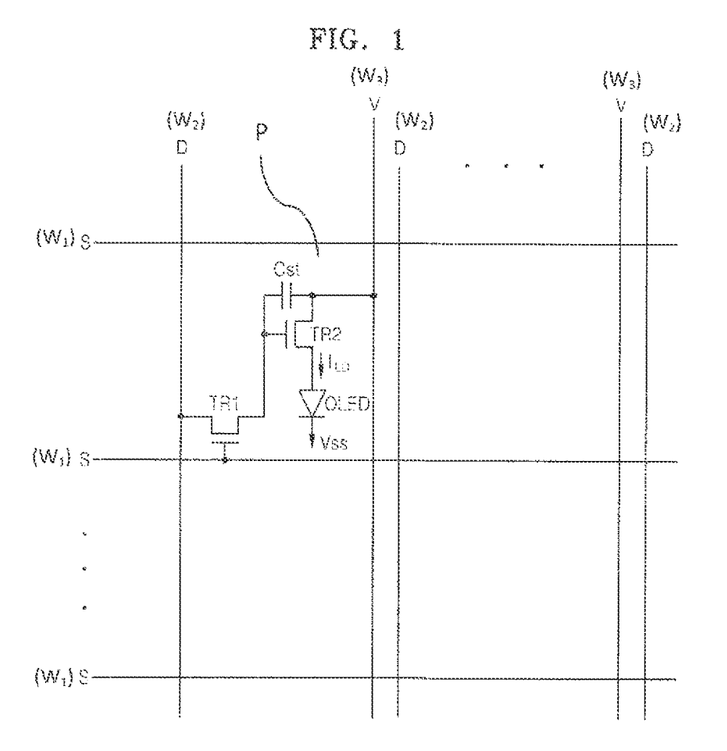
FIG. 1 is an equivalent circuit of an organic light emitting display device according to an embodiment of the present invention.

FIG. 1 is an equivalent circuit of an organic light emitting display device according to an embodiment of the present invention.

Referring to FIG. 1, the equivalent circuit of the organic light emitting display device includes a plurality of pixels P arranged in an array shape by a plurality of first, second, and third wirings W1, W2, and W3.

The first wirings W1 is formed as scanning lines S arranged in a horizontal direction to transmit scanning signals; the second, and third wirings W2, and W3 are formed as data lines D arranged in a vertical direction to transmit data signals; and driving voltage lines V arranged in a vertical direction to transmit a driving voltage.

The pixel P in FIG. 1 includes a switching transistor TR1, a driving transistor TR2, a capacitor Cst, and an organic light emitting display (OLED). In FIG. 1, which shows an embodiment of the present invention, the pixel P includes two transistors (TR1 and TR2), one OLED, and one capacitor (Cst). However, the pixel P according to the present invention is not limited thereto, that is, the pixel P may include more transistors and more capacitors.

The switching transistor TR1 includes a gate terminal, a source terminal, and a drain terminal. The gate terminal is connected to the scanning lines S, the source terminal is connected to the data lines D, and the drain terminal is connected to the driving transistor TR2. The switching transistor TR1 transmits a data signal to the driving transistor TR2 in response to a scan signal applied to the gate terminal of driving transistor TR1.

The driving transistor TR2 includes a gate terminal, a source terminal, and a drain terminal. The gate terminal is connected to the switching transistor TR1, the source terminal is connected to driving voltage lines V, and the drain terminal is connected to the OLED. The driving transistor TR2 outputs an output current, the intensity of the output current varies depending on a voltage applied between the gate terminal and the drain terminal of driving transistor TR2.

The capacitor Cst is connected between the gate terminal and the source terminal of the driving transistor TR2. The capacitor Cst stores a data signal applied to the gate terminal of the driving transistor TR2, and maintains the data signal after the switching transistor TR1 is turned off.

The OLED includes an anode connected to the drain terminal of the driving transistor TR2 and a cathode connected to a common voltage Vss. The OLED generates light with different intensities in response to a current outputted from the driving transistor TR2.

Figure 2:
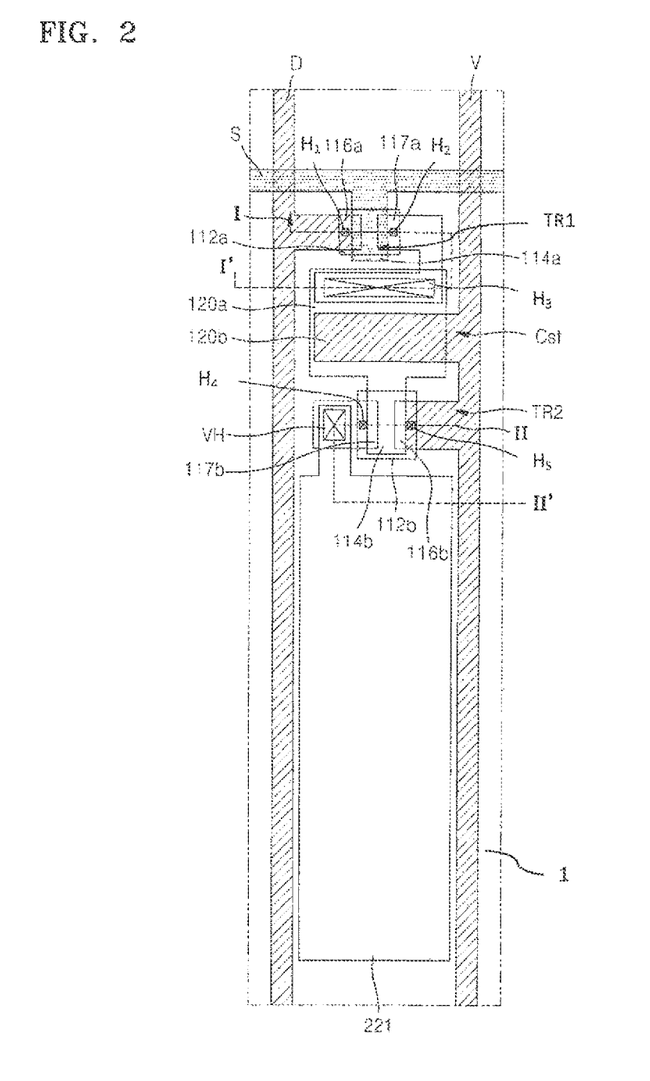
FIG. 2 is part of a plan view of the organic light emitting display device of FIG. 1.
Figure 3:
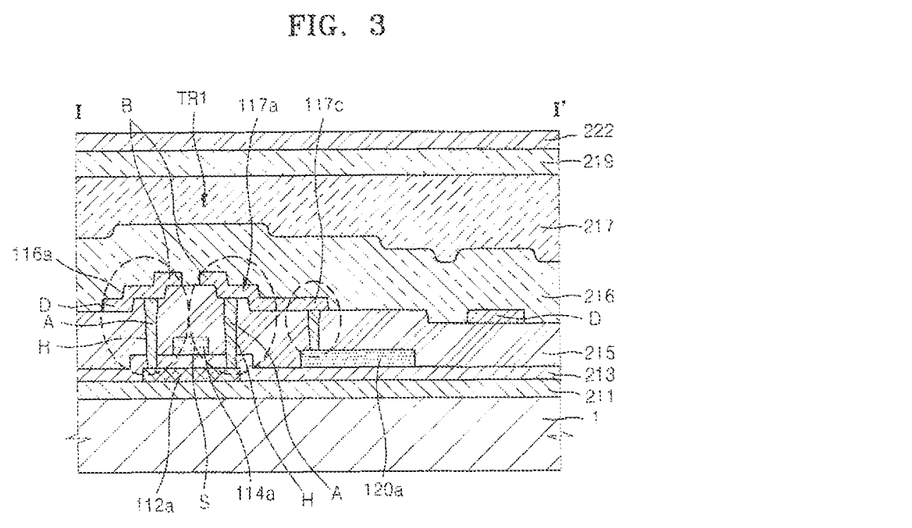
FIG. 3 is a cross-sectional view taken along line I-I' of FIG. 2.

FIG. 2 is part of a plan view of the OLED device of FIG. 1. FIG. 3 is a cross-sectional view taken along line I-I' of FIG. 2, and FIG. 4 is a cross-sectional view taken along line II-II' of FIG. 2.

Figures 4, 5:
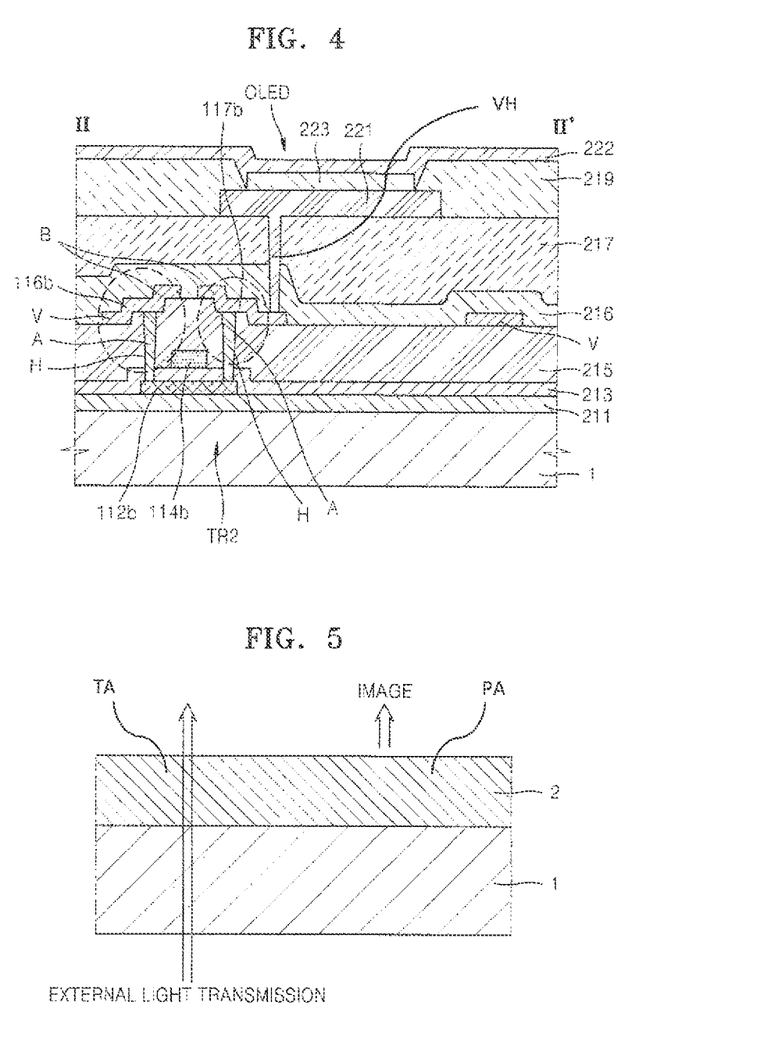
FIG. 4 is a cross-sectional view taken along line II-II' of FIG. 2.
FIG. 5 is a conceptual drawing of an organic light emitting display device according to another embodiment of the present invention.

In FIGS. 2 through 4, a sealing substrate and a sealing thin film layer are omitted for convenience of explanation. In FIGS. 2 through 4, a top gate type transistor is depicted as describing the present invention. However, the present invention is not limited thereto. The switching transistor TR1 and the driving transistor TR2 may be thin film transistors (TFTs).

Referring to FIG. 2, a scanning line S is formed in a horizontal direction on a substrate 1. In addition, a data line D and a driving voltage line V are formed in a vertical direction on the substrate 1. The switching transistor TR1 is connected to the scanning line S and the data line D.

A first gate electrode 114a of the switching transistor TR1 extends from the scanning line S. In addition, a first source electrode 116a extends from the data line D. According to the current embodiment, the data line D is formed of graphene. Accordingly, the first source electrode 116a of the switching transistor TR1 is also formed of graphene.

Meanwhile, the first source electrode 116a and a first drain electrode 117a of the switching transistor TR1 are connected to a first active layer 112a. Thus, when a scanning signal is applied to the scanning line S, a data signal inputted through the data line D is transmitted to the first drain electrode 117a of the switching transistor TR1 through the first source electrode 116a and the first active layer 112a of the switching transistor TR1. According to the current embodiment, a portion of the first source electrode 116a of the switching transistor TR1 buried in an opening H so as to connect the data line D and the first active layer 112a is formed of a metal or a metal oxide. Meanwhile, since the first drain electrode 117a is formed together with the first source electrode 116a, the first drain electrode 117a has the same structure as the first source electrode 116a.

Referring to FIGS. 2 and 3, an extended portion 117c of the first drain electrode 117a of the switching transistor TR1 is connected to one end of a first electrode 120a of the capacitor Cst through the opening H. A portion of the first drain electrode 117a buried in the opening H is formed of a metal or a metal oxide, and the other portion of the first drain electrode 117a that is not buried in the opening H is formed of graphene.

Referring to FIG. 2, the other end of the first electrode 120a of the capacitor Cst extends to form a second gate electrode 114b of the driving transistor TR2. A second electrode 120b of the capacitor Cst is formed by extending the driving voltage line V. According to the current embodiment of the present invention, the driving voltage line V is formed of graphene. Accordingly, a second electrode 120b of the capacitor Cst connected to the driving voltage line V is also formed of graphene. The driving transistor TR2 will be described with reference to FIG. 4.

The switching transistor TR1 will now be described with reference to FIG. 3.

A buffer layer 211 may be formed on the substrate 1 using an inorganic material such as a silicon oxide or a silicon nitride in order to improve the planarity of the substrate 1.

The first active layer 112a is formed on the substrate 1. The first active layer 112a may be an amorphous silicon layer, a polysilicon layer, or a semiconductor oxide layer such as a $(In_2O_3)a(Ga_2O_3)b(ZnO)c$(G-I—Z—O) layer (where a, b, c respectively satisfies a≧0, b≧0, and c>0). When the first active layer 112a is formed of a semiconductor oxide, a crystallization process is unnecessary and uniformity of the first active layer 112a is improved since the first active layer 112a is in an amorphous state.

The first gate electrode 114a is formed on the first active layer 112a. The first gate electrode 114a may be formed in a mono-layer or multi-layers using a conductive metal. The first gate electrode 114a may be formed of a material such as MoW, or Al/Co in consideration of tightness with a neighbouring layer, planarity of stacked surface, and processing ability, but the present invention is not limited thereto.

A gate insulating layer 213 is formed between the first active layer 112a and the first gate electrode 114a for insulating them from each other. An interlayer 215 as an insulating layer is formed on the first gate electrode 114a and the gate insulating layer 213. The interlayer 215 may be a mono-layer or multi-layers, and may be formed of a silicon oxide, a tantalum oxide, or an aluminium oxide, but the present invention is not limited thereto. The gate insulating layer 213 and the interlayer 215 include openings H connected to the first active layer 112a.

The first source electrode 116a and the first drain electrode 117a are formed on the interlayer 215. According to the current embodiment, each of the first source electrode 116a and the first drain electrode 117a includes a first portion A and a second portion B.

The first portion A is buried in the opening H, and is located between the second portion 8 and the first active layer 112a in order to electrically connect the second portion B and the first active layer 112a. The first portion A is formed of a conductive metal or a conductive metal oxide. For example, the first portion A may be formed of at least one metal selected from the group consisting of Ti, Mo, Al, and Cu. Also, the first portion A may be formed of at least a metal oxide selected from the group consisting of ITO, IZO, ZnO, $In_2O_3$, $SnO_2$, and $AlZnO_x$.

The second portion. B is formed on the interlayer 215. The second portion B of the first source electrode 116a of the switching transistor TR1 is formed by extending the data line D, and thus, is formed of graphene like the data line D. The first drain electrode 117a of the switching transistor TR1 is formed together with the first source electrode 116a, and thus, has the same structure and is formed of the same material as the first source electrode 116a.

Graphene is a polycyclic aromatic molecule in which a plurality of carbon atoms is connected through a covalent bond. The carbon atoms connected by covalent bond form a six-membered ring as a basic repeating unit. However, the carbon atoms also form a five-membered ring or a seven-membered ring. Graphene referred in the current present invention is a sheet shaped graphene in which carbon atoms are covalently bonded (typically $sp^2$ hybridization) to each other to form a mono-layer. However, the graphene may have various structures, and the structure may vary according to the numbers of the five-membered rings or the seven-membered rings that can be included in the graphene. The graphene may be a mono-layer of covalent bonded carbon atoms as described above. However, the present invention is not limited thereto, that is, the mono-layer of covalent bonded carbon atoms may form multiple layers by stacking multiple numbers of the mono-layer of covalent bonded carbon atoms. Usually, end-sides of the graphene are saturated by hydrogen.

Graphene has several characteristics such as higher impact resistance and flexibility, higher transparency, and higher electrical conductivity than a metal oxide such as indium tin oxide (ITO). Graphene developed so far has an area surface resistance as remarkably low as about 30 ohm/sq, compared to that of ITO, which is about hundreds of ohm/sq (for example, about 270 to about 500 ohm/sq), thus having high electrical conductivity. Graphene is less likely to scatter and interfere with moving electrons, and thus has a lower resistance than copper by about 35% or greater. Therefore, an organic light emitting display device having high transparency and high electrical conductivity can be obtained when wirings and source/drain electrodes are formed of graphene.

However, since graphene is a mono-layer or multiple layers of covalent bonded carbon atoms, it is difficult to maintain the shape of the graphene when the graphene is buried in the opening H. That is, since the graphene is formed in a sheet shape, the graphene sheet cannot be buried in the opening H. Although the graphene sheet is buried, the graphene sheet may be damaged. Due to the physical properties of graphene, the graphene is difficult to be used in the first portions A of the first source electrode 116a and the first drain electrode 117a, which are buried in the opening H. Therefore, according to the current embodiment, in order to solve the above problem and to take advantages of the graphene's characteristics, the first portions A of the first source electrode 116a and the first drain electrode 117a of the driving transistor TR1 are formed of a metal or a metal oxide, and the second portion B of the first drain electrode 117a and the second portion B of the first source electrode 116a connected to the data line D are formed of graphene. In this way, the material for forming wirings included in the organic light emitting display device can be graphene.

The first portions A may be formed by depositing a metal or a metal oxide in the openings H. Also, the second portions B and the wirings D and V may be formed by patterning a graphene sheet according to the shapes of the wirings D and V and the first source electrode 116a, and the first drain electrode 117a after disposing the graphene sheet on the buried openings H and the interlayer 215.

At least one insulating layer is formed on the first source electrode 116a and the first drain electrode 117a. For example, a passivation layer 216 for protecting the switching transistor TR1 and a planarizing layer 217 for planarizing a surface of the resultant product that has a non-uniform surface due to the structure of the switching transistor TR1 are formed on the first source electrode 116a and the first drain electrode 117a. For example, the passivation layer 216 may be formed of an inorganic material such as a silicon nitride or a silicon oxide. The planarizing layer 217 may be formed of an organic material such as benzocyclobutene (BCB) or acryl. However, the passivation layer 216 and the planarizing layer 217 are not limited thereto.

Referring to FIG. 2 again, the second gate electrode 114b of the driving transistor TR2 is connected to the other end of the first electrode 120a of the capacitor Cst. Also, a second source electrode 116b of the driving transistor TR2 is formed by extending the driving voltage line V. According to the current embodiment, the driving voltage line V is formed of graphene. Accordingly, the second source electrode 116b of the driving transistor TR2 is also formed of graphene. The second source electrode 116b and a second drain electrode 117b of the driving transistor TR2 are connected to a second active layer 112b through the opening H. According to the current embodiment of the present invention, a portion of the second source electrode 116b of the driving transistor TR2 buried in the opening H so as to connect the driving voltage line V. The second active layer 112b is not formed of graphene, but is formed of a metal or a metal oxide.

The driving transistor TR2 will now be described with references to FIG. 4.

First, as the same as the switching transistor TR1, the buffer layer 211 is formed on the substrate 1 using an inorganic material such as a silicon oxide or a silicon nitride to improve planarity of the substrate 1.

The second active layer 112b is formed on the substrate 1. The second active layer 112b may be an amorphous silicon layer, a polycrystalline silicon layer, or a semiconductor oxide layer such as a G-I—Z—O layer (where a, b, and c respectively satisfies $a≧0$, $b≧0$, and $c>0$).

The second gate electrode 114b is formed on the second active layer 112b. The second gate electrode 114b may be formed in a mono-layer or multi-layers using a conductive metal.

The gate insulating layer 213 is formed between the second active layer 112b and the second gate electrode 114b to insulate them from one another. The interlayer 215 as an insulating layer is formed on the second gate electrode 114b and the gate insulating layer 213. The Interlayer 215 may be a mono-layer or multi-layers. The gate insulating layer 213 and the interlayer 215 include openings H connected to the second active layer 112b.

The second source electrode 116b and the second drain electrode 117b are formed on the interlayer 215. According to the current embodiment, each of the second source electrode 116b and the second drain electrode 117b includes a first portion A and a second portion B.

The first portion A is buried in the opening H, and is located between the second portion B and the second active layer 112b to electrically connect the second portion B and the second active layer 112b. The first portion A is formed of a conductive metal or a conductive metal oxide. For example, the first portion A may be formed of at least one metal selected from the group consisting of Ti, Mo, Al, and Cu. Also, the first portion A may be formed of at least a metal oxide selected from the group consisting of ITO. IZO, ZnO, $In_2O_3$, $SnO_2$, and $AlZnO_x$.

The second portion B is formed on the interlayer 215. The second portion B of the second source electrode 116b of the driving transistor TR2 is formed by extending the driving voltage line V, and thus, is formed of graphene like the driving voltage line V. The second drain electrode 117b of the driving transistor TR2 is formed together with the second source electrode 116b, and thus, has the same structure and is formed of the same material as the second source electrode 116b.

As described above, when the wirings and the second source electrode 116b and the second drain electrode 117b are formed of graphene, an organic light emitting display device having high transparency and high electrical conductivity can be manufactured.

However, since graphene has a structure in which thin carbon structures are stacked, it is difficult to maintain the shape of the graphene when the graphene is buried in the opening H. Due to the physical properties of graphene, the graphene can be hardly used in the first portions A of the second source electrode 116b and the second drain electrode 117b, which are buried in the opening H. Therefore, according to the current embodiment, in order to solve the above problem and to take advantages of the graphene's characteristics, the first portions A of the second source electrode 116b and the second drain electrode 117b of the driving transistor TR2 are formed of a metal or a metal oxide, and the second portion B of the second drain electrode 117b, and the second portion B of the second source electrode 116b connected to the driving voltage line V are formed of graphene. In this way, the material for forming wirings included in the organic light emitting display device can graphene.

At least one insulating layer is formed on the second source electrode 116b and the second drain electrode 117b. For example, the passivation layer 216 for protecting the driving transistor TR2 and the planarizing layer 217 for planarizing a surface of the resultant product that has a non-uniform surface due to the structure of the driving transistor TR2 are formed on the second source electrode 116b and the second drain electrode 117b. For example, the passivation layer 216 may be formed of an inorganic material such as a silicon nitride or a silicon oxide. The planarizing layer 217 may be formed of an organic material such as benzocyclobutene (BCB) or acryl. However, the passivation layer 216 and the planarizing layer 217 are not limited thereto.

After forming the passivation layer 216 and the planarizing layer 217, a via hole VH is formed in the passivation layer 216 and the planarizing layer 217 on a location corresponding to the second drain electrode 117b so as to electrically connect a pixel electrode 221 and the second drain electrode 117b of the driving transistor TR2. The pixel electrode 221 will be formed in a subsequent process.

Next, referring to FIG. 4, an OLED is formed on the planarizing layer 217. The OLED includes the pixel electrode 221, a light emitting member 223, and a facing electrode 222. The pixel electrode 221 of the OLED is connected to the second drain electrode 117b of the driving transistor TR2 through the via hole VH.

The pixel electrode 221 is formed on the planarizing layer 217. After forming the pixel electrode 221, a pixel defining layer 219 that exposes at least a portion of the pixel electrode 221 through a pixel opening is formed on at least a portion of the pixel electrode 221. The light emitting member 223 is formed on the pixel electrode 221 exposed through the pixel opening. The light emitting member 223 includes an organic light emitting layer. The facing electrode 222 is formed on the light emitting member 223 and the pixel defining layer 219. Thus, when an appropriate condition is achieved between the pixel electrode 221 and the facing electrode 222 in response to a voltage applied to the pixel electrode 221, light is emitted from the OLED.

In the case of a top emission type structure in which an image is realized in a direction towards the facing electrode, the pixel electrode 221 may be a reflection electrode. In addition, the facing electrode 222 may be an optical transmitting electrode in this case, the facing electrode 222 may include a semi-transparent reflection film having a thin film formed of Ag, Mg, Al, Pt, Pd, Au, Ni, Nd, Ir, Cr, Li, and Ca, or an optical transparent metal oxide such as ITO, indium zinc oxide (IZO), or ZnO. In the case of a bottom emission type structure, the facing electrode 222 may have a reflection function by depositing a metal such as Ag, Mg, Al, Pt, Pd, Au, Ni, Nd, Ir, Cr, Li, or Ca.

When the pixel electrode 221 is used as an anode electrode, the pixel electrode 221 is formed to include a layer formed of a metal oxide having high work function (absolute value), such as ITO, IZO, or ZnO. When the pixel electrode 221 is used as a cathode electrode, the pixel electrode 221 is formed of a metal having a low work function (absolute value), such as Ag, Mg, Al, Pt, Pd, Au, Ni, Nd, Ir, Cr, Li, or Ca. When the pixel electrode 221 is used as an anode electrode, the facing electrode 222 can be used as a cathode electrode, and vice versa.

As described above, in the organic light emitting display device according to an embodiment of the present invention, data lines D, driving voltage lines V, second portions B of source electrodes of transistors connected to the data lines D and the driving voltage lines V, and second portions B of the drain electrode of the transistors are formed of graphene having high transmittancy to external light and high electrical conductivity. Therefore, an organic light emitting display device having high electrical conductivity and high transparency can be obtained.

FIG. 5 is a conceptual drawing of an organic light emitting display device according to another embodiment of the present invention.

Referring to FIG. 5, the organic light emitting display device includes a display unit 2 on a first surface of the substrate 1. In the organic light emitting display device of FIG. 5, external light passes through the substrate 1 and the display unit 2. The display unit 2 includes a transmitting region TA through which the external light can pass, the transmitting region TA will be described later. That is, the transmitting region TA is included such that, as indicated in FIG. 6, the user positioned on a side where an image is displayed can be able to see the image displayed on a lower outside of the organic light emitting display device.

That is, the organic light emitting display device according to the current embodiment of the present invention includes the transmitting region TA through which external light passes, a pixel region PA that is adjacently disposed to the transmitting region TA, the equivalent circuit of FIG. 1, and an OLED.

Figure 6:
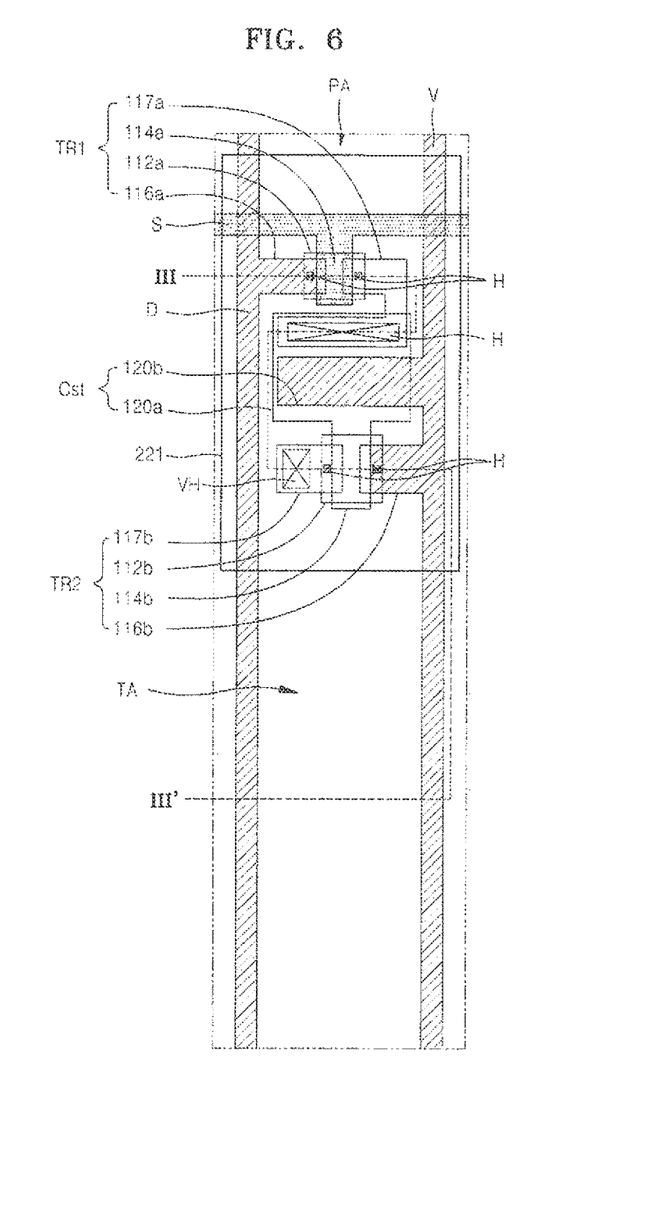
FIG. 6 is part of a plan view of the organic light emitting display device of FIG. 5.
Figure 7:
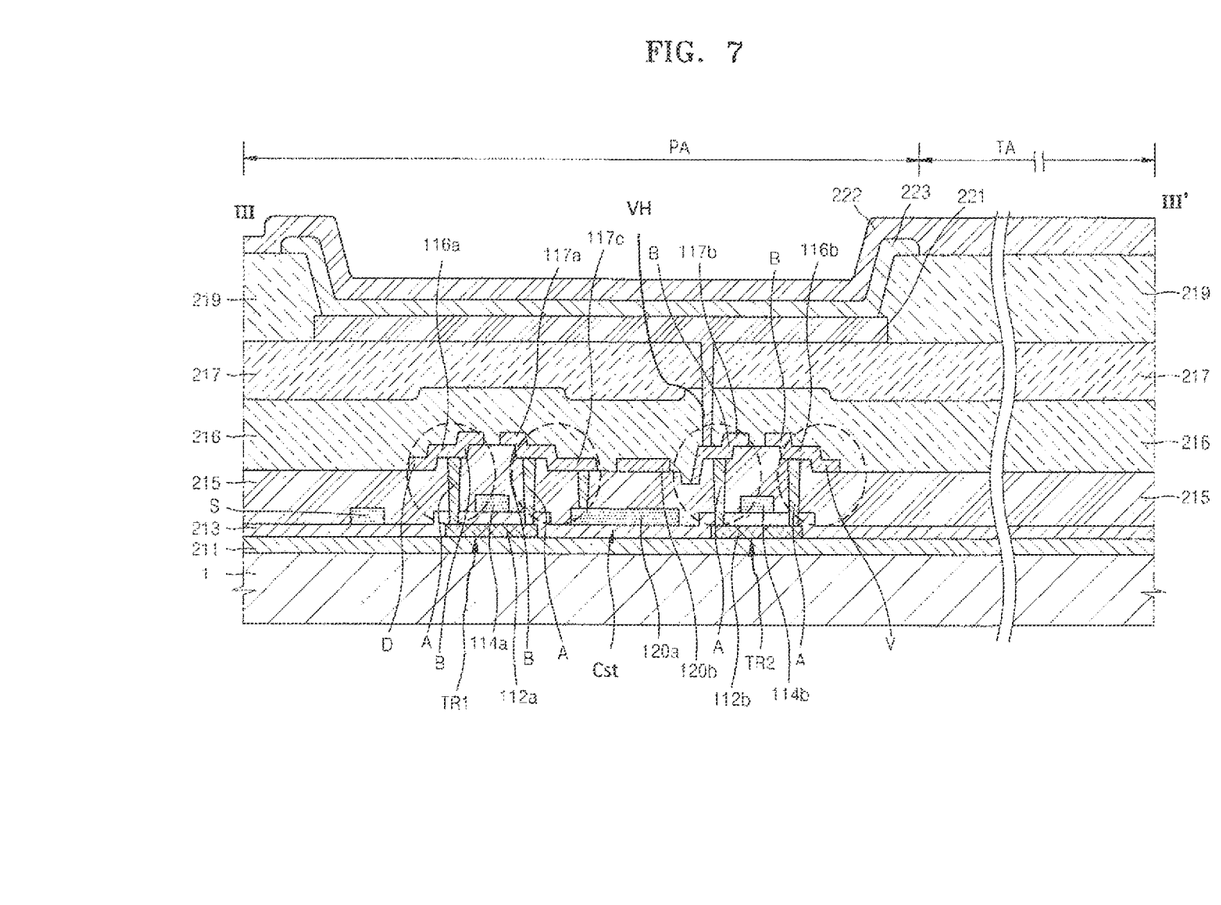
FIG. 7 is a cross-sectional view taken along line of FIG. 6.

FIG. 6 is a part of a plan view of the organic light emitting display device of FIG. 5. FIG. 7 is a cross-sectional view taken along line III-III' of FIG. 6.

Referring to FIGS. 6 and 7, according to an embodiment of the present invention, the organic light emitting display device is different from the organic light emitting display device described with reference to FIGS. 2 and 4 because the organic light emitting display device described with reference to FIGS. 6 and 7 includes the transmitting region TA to transmit external light. In addition, the pixel region PA is disposed close to the transmitting region TA, and the pixel electrode 221 is located in the pixel region PA.

In FIGS. 6 and 7, a sealing substrate and a sealing thin film layer are omitted for convenience of explanation. In addition, in FIGS. 6 and 7, a top gate type transistor is depicted. However, this is an example for explaining the current embodiment of the present invention, and the present invention is not limited thereto. In addition, the switching transistor TR1, the capacitor Cst, and the driving transistor TR2 are included in the pixel region PA. However, the structures and operations of the switching transistor TR1, the capacitor Cst, and the driving transistor TR2 are substantially the same as the descriptions made with reference to FIGS. 2 through 4, and thus, the descriptions thereof will not be repeated.

Referring to FIG. 6, a scanning line S is formed in a horizontal direction on the substrate 1. The scanning line S is formed to pass through the pixel region PA. A data line D and a driving voltage line V are formed in a vertical direction. The data line D and the driving voltage line V are formed to pass through the pixel region PA and the transmitting region TA. The switching transistor TR1, the capacitor Cst, and the driving transistor TR2 are located in the pixel region PA.

The switching transistor TR1 is connected to the scanning line S and the data line D. Referring to FIG. 6, a first gate electrode 114a of the switching transistor TR1 is extended from the scanning line S. In addition, a first source electrode 116a of the switching transistor TR1 is extended from the data line D. According to the current embodiment of the present invention, the data line D is formed of graphene. Accordingly, the first source electrode 116a of the switching transistor TR1 is formed of graphene. Meanwhile, the first source electrode 116a and the first drain electrode 117a of the switching transistor TR1 are connected to the first active layer 112a through openings H. According to the current embodiment of the present invention, a portion of the first source electrode 116a buried in the opening H so as to connect the data line D. The first active layer 112a is formed of a metal or a metal oxide. However, since the first drain electrode 117a is formed together with the first source electrode 116a, the first drain electrode 117a has the same structure as the first source electrode 116a. That is, the first drain electrode 117a is formed of graphene.

Referring to FIG. 7, an extended portion 117c of the first drain electrode 117a of the switching transistor TR1 is connected to the first electrode 120a of the capacitor Cst through the opening H. At this point, a portion of the first drain electrode 117a buried in the opening H is formed of a metal or a metal oxide, and the other portion of the first drain electrode 117a that is not buried in the opening H is formed of graphene.

The second gate electrode 114b of the driving transistor TR2 is formed by extending the other end of the first electrode 120a of the capacitor Cst. The second electrode 120b of the capacitor Cst is formed by extending the driving voltage line V. According to the current embodiment of the present invention, the driving voltage line V is formed of graphene. Accordingly, the second electrode 120b of the capacitor Cst connected to the driving voltage line V is also formed of graphene.

The second gate electrode 114b of the driving transistor TR2 is connected to the other end of the first electrode 120a of the capacitor Cst. The second source electrode 116b of the driving transistor TR2 is formed by extending the driving voltage line V. According to the current embodiment of the present invention, the driving voltage line V is formed of graphene. Accordingly, the second source electrode 116b is also formed of graphene. The second source electrode 116b and the second drain electrode 117b of the driving transistor TR2 are connected to the second active layer 112b through the openings H. According to the current embodiment of the present invention, it is an aspect that a portion of the second source electrode 116b of the driving transistor TR2 buried in the opening H so as to connect the driving voltage line V and the second active layer 112b is formed of a metal or a metal oxide. Since the second drain electrode 117b is formed together with the second source electrode 116b, the second drain electrode 117b has the same structure as the second source electrode 116b.

According to the current embodiment of the present invention, the data line D and the driving voltage line V that are disposed to pass through the transmitting region TA are formed of transparent graphene. Accordingly, even if the data line D and the driving voltage line V pass through the transmitting region TA, the transmittancy to external light of the transmitting region TA is not reduced. The scanning line S that is not formed of graphene is disposed not to pass through the transmitting region TA but to pass through the pixel region PA. In this way, in the organic light emitting display device according to the current embodiment of the present invention, a region on which an image is displayed is divided into the pixel region PA and the transmitting region TA, and the wirings that pass through the transmitting region TA are formed of transparent graphene. Therefore, the transmittancy of the entire region where an image is displayed can be increased when compared to a conventional transparent display device, by increasing the transmittancy of the transmitting region TA of the organic light emitting display device.

According to the current embodiment of the present invention, the pixel region PA including the pixel electrode 221 connected to the driving transistor TR2, and electronic devices such as the driving transistor TR2, the switching transistor TR1, and the capacitor Cst overlap the pixel electrode 221 to be covered by the pixel electrode 221. As shown in FIG. 6, when the user is viewed, the electronic devices described above are covered by the pixel electrode 221, and also, a large portion of the scanning line S is also covered by the pixel electrode 221. In addition, since part of the entire wirings that pass through the transmitting region TA are formed of transparent graphene, the total transmittancy of the organic light emitting display device is increased, and thus, the user can see an external image through the transmitting region TA.

FIG. 7 is a cross-sectional view taken along line III-III' of FIG. 6. Descriptions of elements that are substantially identical to the elements described with reference to FIGS. 3 and 4 are not repeated.

Referring to FIG. 7, a buffer layer 211 is formed on a substrate 1, and the switching transistor TR1, the capacitor Cst, and the driving transistor TR2 are formed on the buffer layer 211.

The buffer layer 211 improves the planarity of a surface of the substrate 1 and prevents foreign materials penetrating from the substrate 1.

A first active layer 112a and a second active layer 112b are formed on the buffer layer 211. A first gate electrode 114a and a second gate electrode 114b are respectively formed on the first active layer 112a and the second active layer 112b. The first gate electrode 114a and the second gate electrode 114b may be formed in a mono-layer or multi-layers using a conductive metal.

A gate insulating layer 213 for insulating the first active layer 112a and the second active layer 112b from the first gate electrode 114a and the second gate electrode 114b is formed between the first active layer 112a and the second active layer 112b and the first gate electrode 114a and the second gate electrode 114b. An interlayer 215 as an insulating layer is formed on the first gate electrode 114a, and the second gate electrode 114b, and the gate insulating layer 213 may be formed in a mono-layer or multi-layers. The gate insulating layer 213 and the interlayer 215 respectively include openings H connected to the first active layer 112a and the second active layer 112b.

A first source electrode 116a, a first drain electrode 117a, a second source electrode 116b, and a second drain electrode 117b are formed on the interlayer 215. According to the current embodiment of the present invention, each of the first source electrode 116a and the first drain electrode 117a and the second source electrode 116b and the second drain electrode 117b respectively includes first portions A and second portions B.

The first portions A are buried in the openings H, and the first portions A electrically respectively connect the first active layer 112a and the second active layer 112b to the second portions B. The first portions A may be formed of a conductive metal or a conductive metal oxide. For example, the first portions A may be formed of at least a metal selected from the group consisting of Ti, Mo, Al, and Cu. Also, the first portions A may be formed of at least a metal oxide selected from the group consisting of ITO, IZO, ZnO, $In_2O_3$, $SnO_2$, and $AlZnO_x$.

The second portions B are formed on the interlayer 215. The second portion B of the first source electrode 116a of the switching transistor TR1 is formed by extending the data line D, and is formed of graphene as the same as the data line D. In addition, the second portion B of the second source electrode 116b of the driving transistor TR2 is formed by extending the driving voltage line V, and thus, is formed of graphene like the driving voltage line V. Meanwhile, since the first drain electrode 117a of the switching transistor TR1 is formed together with the first source electrode 116a, the first drain electrode 117a has the same structure as the first source electrode 116a. In addition, since the second drain electrode 117b of the driving transistor TR2 is formed together with the second source electrode 116b, the second drain electrode 117b has the same structure as the second source electrode 116b.

A passivation layer 216 and a planarizing layer 217 may be formed on the source and drain electrodes 116a, 117a, 116b and 117b. After forming the passivation layer 216 and the planarizing layer 217, a via hole VH may be formed at a location in the passivation layer 216 and the planarizing layer 217 corresponding to the second drain electrode 117b so that a pixel electrode 221, which will be formed later, can be electrically connected to the second drain electrode 117b.

Next, an OLED is formed on the planarizing layer 217. The OLED includes the pixel electrode 221, a light emitting device 223, and a facing electrode 222. The pixel electrode 221 of the OLED is connected to the second drain electrode 117b through the via hole VH.

The pixel electrode 221 locates in a pixel region PA, and is formed on the planarizing layer 217. After forming the pixel electrode 221, a pixel defining layer 219 that exposes at least a portion of the pixel electrode 221 through a pixel opening is formed on at least a portion of the pixel electrode 221. Although not shown, the passivation layer 216 and the planarizing layer 217 located in the transmitting region TA may be etched. In this way, a transparent organic light emitting display device having increased transmittancy of external light can be manufactured.

The light emitting device 223 is formed on the pixel electrode 221 exposed through the pixel opening. The light emitting device 223 includes an organic light emitting layer. The facing electrode 222 is formed on the light emitting device 223 and the pixel defining layer 219. The facing electrode 222 may be formed in both the pixel region PA and the transmitting region TA.

In FIGS. 6 and 7, the passivation layer 216, gate insulating layer 213, interlayer 215, the planarizing layer 217, and the pixel defining layer 219 may be formed of a transparent material. In addition, the substrate 1 may have high transmittancy. In this way, a transparent organic light emitting display device having high transmittancy can be manufactured.

Figure 8:
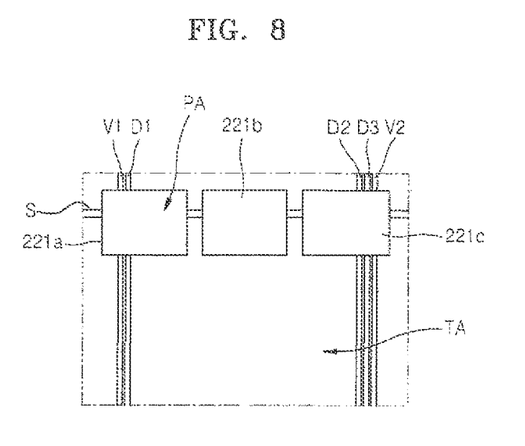
FIG. 8 is a schematic drawing of a transparent organic light emitting display device according to another embodiment of the present invention.

FIG. 8 is a schematic drawing of a transparent organic light emitting display device according to another embodiment of the present invention.

Referring to FIG. 8, a transmitting region TA is formed with respect to a plurality of sub-pixels. That is, a single transmitting region TA is formed corresponding to a first pixel electrode 221a, a second pixel electrode 221b and a third pixel electrode 221c. First through third data lines D1, D2, and D3 are respectively electrically connected to the first through third pixel electrodes 221a, 221b, and 221c. A first driving voltage line V1 is electrically connected to the first pixel electrode 221a and the second pixel electrode 221b, and a second driving voltage line V2 is electrically connected to the third pixel electrode 221c.

The first through third data lines D1, D2, and D3 and the first and second driving voltage lines V1 and V2 are formed of graphene. Accordingly, image distortion can be reduced and transmittancy of an organic light emitting display device can be increased.

In the above structure as shown in FIG. 8, since the single transmitting region TA is formed with respect to three sub-pixels, for example, red R, green G, and blue B sub-pixels, the transmittancy of an organic light emitting display device can further be increased, and image distortion due to light scattering can also be reduced.

Table 1 shows a comparison of simulation results for the overall transmittancy of the transparent organic light emitting display device (OLED) of FIG. 6 with respect to wiring transmittancy. Graphene has as high transmittancy as about 85%. Thus, if including graphene wirings, an OLED may have an overall transmittancy of at least about 46.9%, which is remarkably higher compared to when using metal wiring having very low transmittancy or when using metal oxide wirings having a transmittancy of about 80%. The simulation data in Table 1 were obtained with the assumption that the OLED includes a transparent insulating layer and its opposite electrode has a transmittancy of about 70%.

TABLE 1

| Wiring Transmittancy (%) | OLED's Overall Transmittancy (%) |
|---|---|
| 0 | 36.7 |
| 20 | 38.9 |
| 40 | 41.3 |
| 60 | 44.0 |
| 80 | 46.9 |

While the present invention has been particularly shown and described with reference to exemplary embodiments thereof, it will be understood by those of ordinary skill to in the art that various changes in form and details may be made therein without departing from the spirit and scope of the present invention as defined by the following claims.

What is claimed is:

1. An organic light emitting display device comprising:
a substrate;
a first wiring formed on the substrate in a first direction;
second and third wirings formed on the substrate in a second direction;
a first thin film transistor connected to the first and second wirings;
a second thin film transistor connected to the first thin film transistor and the third wiring; and
an organic light emitting display panel (OLED) connected to the second thin film transistor, wherein the second and third wirings are formed of graphene; and the first thin film transistor comprises:
an active layer formed on the substrate;
a gate electrode formed at a location of the substrate corresponding to the active layer and being insulated from the active layer;
an insulating layer covering the gate electrode and having openings connected to the active layer; and
source and drain electrodes formed on the insulating layer and connected to the active layer through the openings,
wherein the source and drain electrodes comprise first portions buried in the openings and second portions formed on the insulating layer, and
the first portions and the second portions are formed of materials different from each other.

2. The organic light emitting display device of claim 1, wherein the first portions are formed of at least one metal selected from the group consisting of Ti, Mo, Al, and Cu, and the second portions are formed of graphene.

3. The organic light emitting display device of claim 1, wherein the first portions are formed of at least one metal selected from the group consisting of ITO, IZO, ZnO, In2O3, SnO2, and AlZnOx, and
the second portions are formed of graphene.

4. The organic light emitting display device of claim 1, wherein the second portions are connected to the second wiring, and are formed of the same material as the second wiring.

5. The organic light emitting display device of claim 1, wherein the second thin film transistor comprises:
an active layer formed on the substrate;
a gate electrode formed on a location of the substrate corresponding to the active layer and being electrically insulated from the active layer;
an insulating layer covering the gate electrode and having openings connected to the active layer; and
source and drain electrodes formed on the insulating layer and connected to the active layer through the openings,
wherein the source and drain electrodes comprise first portions buried in the openings and second portions formed on the insulating layer, and
the first portions and the second portions are formed of materials different from each other.

6. The organic light emitting display device of claim 5, wherein the first portions are formed of at least one metal selected from the group consisting of Ti, Mo, Al, and Cu, and the second portions are formed of graphene.

7. The organic light emitting display device of claim 5, wherein the first portions are formed of at least one metal selected from the group consisting of ITO, IZO, ZnO, In2O3, SnO2, and AlZnOx, and
the second portions are formed of graphene.

8. The organic light emitting display device of claim 5, wherein the second portions are connected to the third wiring, and are formed of the same material as the second wiring.

9. The organic light emitting display device of claim 5, wherein the organic light emitting display panel comprises:
a pixel electrode connected to the drain electrode;
a facing electrode formed facing the pixel electrode; and
a light emitting member interposed between the pixel electrode and the facing electrode and generates visible light.

10. The organic light emitting display device of claim 1, wherein the second portions are connected to the second wiring, and are formed of the same material as the second wiring.

11. The organic light emitting display device of claim 1, wherein the second thin film transistor comprises:
an active layer formed on the substrate;
a gate electrode formed on a location of the substrate corresponding to the active layer by being electrically insulated from the active layer;
an insulating layer covering the gate electrode and having openings connected to the active layer; and
source and drain electrodes formed on the insulating layer and connected to the active layer through the openings,
wherein the source and drain electrodes comprise first portions buried in the openings and second portions formed on the insulating layer, and
the first portions and the second portions are formed of materials different from each other.

12. The organic light emitting display device of claim 11, wherein the first portions are formed of at least one metal selected from the group consisting of Ti, Mo, Al, and Cu, and the second portions are formed of graphene.

13. The organic light emitting display device of claim 11, wherein the first portions are formed of at least one metal selected from the group consisting of ITO, IZO, ZnO, In2O3, SnO2, and AlZnOx, and
the second portions are formed of graphene.

14. The organic light emitting display device of claim 11, wherein the second portions are connected to the third wiring, and are formed of the same material as the second wiring.

15. An organic light emitting display device comprising:
a substrate having a transmitting region through which external light passes and a pixel region located adjacent to the transmitting region;
a first wiring formed on the substrate in a first direction to pass through the pixel region;
second and third wirings formed on the substrate in a second direction to pass through the pixel region and the transmitting region;
a first thin film transistor located in the pixel region and connected to the first and second wirings;
a second thin film transistor located in the pixel region and connected to the first thin film transistor and the third wiring;
a pixel electrode connected to the second thin film transistor, located in the pixel region, and disposed to cover the first and second thin film transistors;
a facing electrode facing the pixel electrode, and allowing light to pass therethrough, the facing electrode being located across the transmitting region and the pixel region; and
a light emitting member interposed between the pixel electrode and the facing electrode and generates light,
wherein the second and third wirings are formed of graphene; and
the first thin film transistor comprises:
an active layer formed on the substrate;
a gate electrode formed at a location of the substrate corresponding to the active layer and being insulated from the active layer;
an insulating layer covering the gate electrode and having openings connected to the active layer; and
source and drain electrodes formed on the insulating layer and connected to the active layer through the openings, wherein the source and drain electrodes comprise first portions buried in the openings and second portions formed on the insulating layer, and the first portions and the second portions are formed of materials different from each other.

16. The organic light emitting display device of claim 15, wherein the first portions are formed of at least one metal selected from the group consisting of Ti, Mo, Al, and Cu, and the second portions are formed of graphene.

17. The organic light emitting display device of claim 15, wherein the first portions are formed of at least one metal selected from the group consisting of ITO, IZO, ZnO, In2O3, SnO2, and AlZnOx, and the second portions are formed of graphene.

* * * * *